United States Patent
Paszkiet et al.

[11] Patent Number: 5,928,568
[45] Date of Patent: Jul. 27, 1999

[54] THICK FILM CIRCUIT HAVING CONDUCTOR COMPOSITION WITH COATED METALLIC PARTICLES

[75] Inventors: Christine Ann Paszkiet; Dwadasi Hare Rama Sarma, both of Kokomo, Ind.

[73] Assignee: Delco Electonics Corporation, Kokomo, Ind.

[21] Appl. No.: 08/954,385

[22] Filed: Oct. 20, 1997

Related U.S. Application Data

[63] Continuation-in-part of application No. 08/668,900, Jun. 24, 1996, Pat. No. 5,716,552.
[51] Int. Cl.$^6$ .............. H01B 1/02; H01B 1/08; H05K 7/06; H05K 1/09
[52] U.S. Cl. .............. 252/512; 252/514; 361/771; 174/257
[58] Field of Search ............ 252/512, 514, 252/519.5, 520.2, 521.3, 521.5; 428/901, 403, 404; 361/760, 771; 174/257

[56] References Cited

U.S. PATENT DOCUMENTS

| | | | |
|---|---|---|---|
| 4,493,789 | 1/1985 | Ueyama et al. | 252/514 |
| 4,521,329 | 6/1985 | Siuta et al. | 252/512 |
| 4,906,404 | 3/1990 | Suehiro et al. | 252/512 |
| 5,207,950 | 5/1993 | Ehrreich | 252/518 |
| 5,294,374 | 3/1994 | Martinez et al. | 252/518 |
| 5,415,944 | 5/1995 | Kazem-Goudarzi et al. | 428/567 |
| 5,453,293 | 9/1995 | Beane et al. | 427/96 |
| 5,716,663 | 2/1998 | Capote et al. | 427/96 |
| 5,737,191 | 4/1998 | Horiuchi et al. | 361/764 |

*Primary Examiner*—Mark Kopec
*Attorney, Agent, or Firm*—Jimmy L. Funke

[57] ABSTRACT

A thick-film conductor paste and thick-film conductors formed therefrom. The conductor paste is composed of metallic particles coated with a barrier layer that reduces leaching and solder diffusion into the conductor, thereby improving the reliability of the conductor-solder bond. The barrier layer may be continuous or discontinuous, and may be applied to some or all of the metallic particles of the conductor paste.

10 Claims, 1 Drawing Sheet

THICK FILM CIRCUIT HAVING CONDUCTOR COMPOSITION WITH COATED METALLIC PARTICLES

RELATED INVENTIONS

This application is a continuation-in-part of copending U.S. patent application Ser. No. 08/668,900, filed on Jun. 24, 1996 now U.S. Pat. No. 5,716,552, and assigned to the assignee of this application.

FIELD OF THE INVENTION

The present invention generally relates to thick-film hybrid circuits, and more particularly to circuits incorporating an improved thick-film conductor ink composition that produces conductors characterized by resistance to leaching and diffusion, improved adhesion, and increased service-life.

BACKGROUND OF THE INVENTION

FIG. 2 represents a thick-film hybrid circuit structure 10 in which a conductor 18 is formed on an alumina substrate 12, and a circuit component 14 is electrically and mechanically connected to the conductor 18 with solder 16. High-conductivity thick-film conductors of the type represented in FIG. 2 are typically formed from a paste containing a metal powder composed of silver, silver and palladium, a silver-palladium alloy, or admixtures of other metal powders. In addition, the paste typically contains glass and/or metal oxide particles as inorganic binders, and an organic vehicle system that serves as a binder for the paste. The conductor paste is deposited on the alumina substrate 12 and fired, such that the organic binder is removed and the powder particles and inorganic binders fuse to form the solid conductor 18. The solder 16 used to secure a circuit component 14 to the conductor 18 is typically a tin-lead composition, frequently near the eutectic composition, with relatively high tin content to allow for lower processing temperatures. FIG. 1 represents a cross-sectional view through a prior art conductor 20, which is depicted as being composed of metal particles 22 in direct contact with each other and the solder 16 (for simplicity and clarity, inorganic binder particles are not shown).

The operability of the hybrid circuit 10 depicted in FIG. 2 requires that the bond between the conductor 18 and solder 16 survive numerous thermal cycles, necessitating that the conductor 18 exhibit adequate solderability such that solder initially wets the conductor surface, and that adhesion between the conductor 18 and solder 16 is suitably maintained over an extended period of time. When hybrid circuits are used in high temperature applications over extended periods, interactions that occur between the conductor 18 and solder 16 can ultimately lead to degradation of the mechanical integrity of the assembly. It is generally recognized that when a silver-based conductor is soldered with a tin-lead solder, a brittle intermetallic region is formed between the conductor 18 and solder 16 during soldering, and may subsequently increase in thickness during high temperature exposure. The intermetallic region is generally the weak mechanical link of the conductor-solder bond, and is particularly prone to fracturing during thermal cycling due to the differing coefficients of thermal expansion of the intermetallic and the conductor and solder materials, which induces significant stresses at the interface between these structures. Solders, such as tin-lead solders, that exhibit high solderability on thick film conductors tend to promote the formation of this intermetallic region at the conductor-solder interface with metallic conductors. Such solders generally have a greater tendency to leach elemental metal from the conductor 18 during soldering, and promote diffusion of tin from the solder 16 into the conductor 18 during high-temperature exposure. In many applications, the growth of the intermetallic region is limited by the relatively low service temperature of the circuit 10. However, where relatively high temperatures are encountered over long periods of time, the size of the intermetallic region increases significantly, which generally exacerbates the detrimental effect that the intermetallic region has on the service life of the circuit structure.

Accordingly, it would be desirable if the leach resistance of a metallic thick-film conductor could be increased, and its resistance to diffusion of tin increased, so as to minimize the size of the intermetallic region that forms between the conductor and tin-lead solders at elevated temperatures. In doing so, it would be necessary to maintain the wettability and electrical conductivity of the conductor. However, approaches to date to improve leach resistance and tin-diffusion resistance have included increasing the palladium content and the glass content of the films, both of which have had the undesirable effect of increasing the resistance of the conductor.

SUMMARY OF THE INVENTION

The present invention is directed to an improved thick film circuit including a conductor composition printed, dried and fired on a substrate to form a thick-film conductor, and a circuit component connected to the conductor with a tin-based solder, the conductor composition comprising metallic particles selected from the group of silver, palladium, platinum, copper and gold particles; and an inorganic coating on the surface of each of the particles, selected from the group of materials that are both (a) substantially inert at the firing temperature; and (b) non-wettable by the tin-based solder. The coating serves to limit leaching of the conductor's elemental metal into the solder during soldering and diffusion of the solder's elemental tin into the conductor during subsequent high temperature operation of the circuit, thereby limiting the formation of an intermetallic region between the conductor and the solder. Since the extent of the intermetallic region is reduced, the conductor-solder bond is highly resistant to thermal cycle fatigue.

According to the invention, the coating may be continuous or discontinuous, and may be applied to some or all of the particles of the conductor paste. As used herein, a discontinuous coating results in portions of the surface of each particle being un-coated, so as to promote electrical contact between adjacent particles.

The above advantages of this invention are achieved without complicating the printing and firing processes conventionally entailed in forming thick-film conductors. In addition, the conductor paste does not necessitate modifications to tin-lead solder compositions that are desirable from the standpoint of providing a durable and strong bond. Accordingly, solder compositions and processing methods that have been optimized for the fabrication of hybrid circuits are not adversely affected by implementation of this invention.

DETAILED DESCRIPTION OF THE INVENTION

Figure 4:
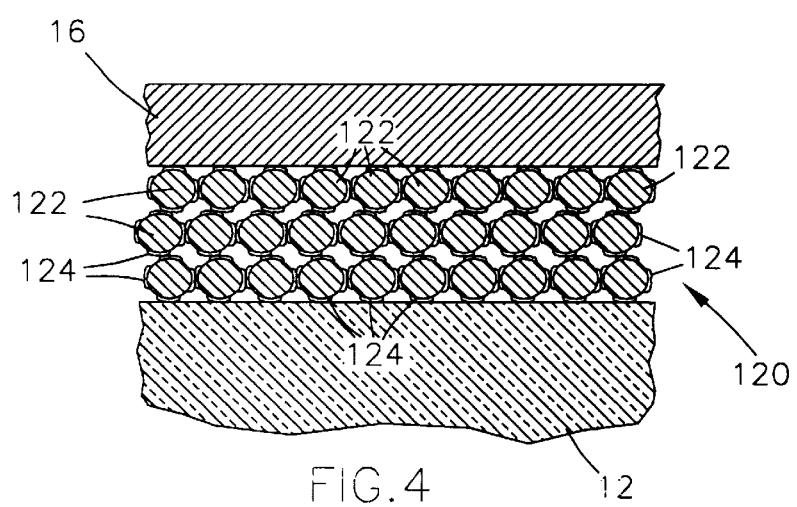
FIG. 4 is a cross-sectional representation of a conductor formed from a thick-film conductor paste in accordance with an embodiment of this invention.

Portrayed in FIG. 4 is a conductor 120 formed by a conductor paste in accordance with this invention. The conductor 120 is shown as being disposed between a substrate 12 and solder 16, the latter of which serves to bond a component 14 (not shown) to the conductor 120, similar to that illustrated in FIG. 2. The substrate 12 is formed from an insulating material, such as alumina, as is conventional in the fabrication of hybrid circuits of the type represented in FIG. 2. Alternatively, substrate 12 can be aluminum nitride, a glass-ceramic, insulated metal, or a layer of un-fired tape in a laminate structure. For high temperature applications, the solder 16 can be a tin-lead composition, of which various formulations are commercially available.

As represented in FIG. 4, the conductor 120 is formed from a conductor paste composed of a metallic powder, each particle 122 of which has an inorganic cladding layer 124. As is typical in the art, the conductor paste that forms the conductor 120 would include an organic vehicle system (not shown) interspersed throughout the metallic powder in order to temporarily bind the particles 122 together and enable deposition of the conductor paste by any suitable printing technique, and would further include an inorganic binder (not shown) that fuses the particles 122 together during firing. The organic and inorganic binders are not illustrated in the Figures in order to simplify the illustrations. The particles 122 can be formed from any material that will adequately conduct electricity, such as silver, palladium, platinum, copper, gold and mixtures and alloys thereof.

Figure 3A:
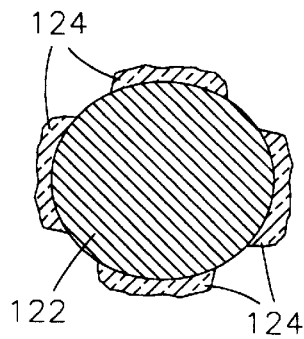
FIGS. 3a through 3d are cross-sectional representations of metallic particles for conductor pastes in accordance with different embodiments of this invention.

As depicted in FIGS. 3a and 4, the cladding layer 124 does not fully encapsulate each particle 122, but instead is discontinuous such that some regions of the surface of each particle 122 remain unclad. This aspect of the invention allows each particle 122 to electrically contact adjacent particles 122 through the unclad surface regions. The material for the cladding layer 124 is solder resistant, and is inert in the sense that it does not alloy with the particles 122 or otherwise directly modify the composition of the particles 122 at thick film firing temperatures. Preferred cladding materials are particularly capable of forming a barrier layer that inhibits leaching of metal from the conductor 120 and diffusion of metal from the solder 16. According to this invention, the cladding layer 124 may comprise glass or refractory compounds such as oxides, silicides and/or nitrides of aluminum, zirconium, beryllium, tungsten, magnesium, calcium, niobium, titanium and zinc, and oxides and/or nitrides of silicon for firing temperatures of 850–100 degrees C. At lower firing temperatures, such as between 500–700 degrees C., other compounds such as oxides of copper, nickel, rhodium and molybdenum would also remain inert, and thus also reduce leaching and diffusion.

An alternate to the embodiment shown in FIG. 4 is to intermix the clad particles 122 shown in FIG. 3a with unclad particles of the same or different composition. Advantageously, this approach to the invention promotes the conductivity of the conductor 120 while still enhancing resistance to leaching and diffusion. The ratio of clad particles 122 to unclad particles can be varied to achieve an optimum balance between solderability and resistance to diffusion for a particular application.

Figure 3B:
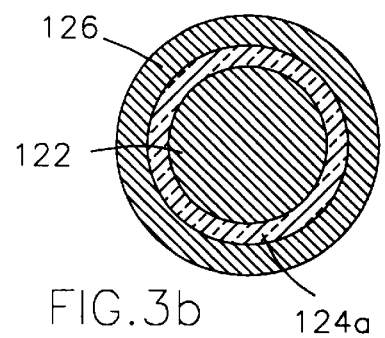
Figure 3C:
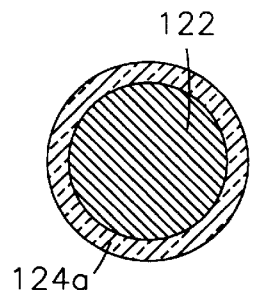
Figure 3D:
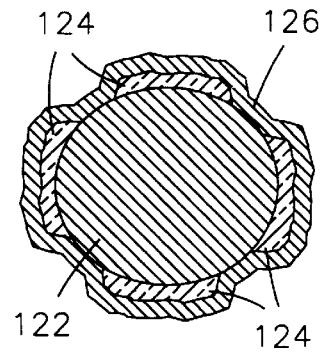

In an alternate embodiment shown in FIG. 3b, metal particles 122 are provided with a continuous cladding layer 124a, over which a metallic coating 126 is deposited. As with the particles 122, the metallic coating 126 is a conductive material, and preferably a metal such as silver, palladium, platinum, copper, gold and mixtures and alloys thereof. The combination of the metal particles 122 and the coating 126 promotes the conductivity of the conductor 120, while the cladding layer 124a again serves to inhibit diffusion of tin from the solder 16 into the conductor 120. Finally, FIGS. 3c and 3d illustrate further embodiments in which a continuous cladding layer 124a is employed without a metallic coating 126, and a discontinuous cladding layer 124 is employed with a continuous metallic coating 126, respectively. It should be noted that, to achieve acceptable electrical conductivity, the embodiment shown in FIG. 3c would be combined with unclad particles and/or a powder composed of any one or more of those particles depicted in FIGS. 3a, 3b and/or 3d.

The approach of using coated particles to make thick-film formulations can also be employed in the manufacture of so-called Low-Temperature Co-fired Ceramic (LTCC) circuits in which thick-film conductors are printed on a glass-ceramic tape. A second layer of tape with appropriate vias is laminated and another conductor layer is generated, and so on. These laminated layers with the thick-film conductors are then fired in a single firing step. This results in the whole circuitry being formed together along with a supporting structure; there is no substrate as such to start with. In this process, the firing temperature is typically 900–950 degrees C. and the firing time is 1–3 hours. Variations in firing times and temperatures are due to differences in tape chemistry and manufacturer. The present invention can be used to make thick-film conductors for this type of process by selecting coating compounds that are chemically inert at these processing temperatures. Thus, all the aforementioned advantages can be realized for the top printed layer or if any soldering occurs on the inner layers, with an opening on the upper layers. Sometimes, the top conductor layer is printed and fired separately much like on an alumina substrate. In this approach also, the current invention finds application and utility.

Figure 1:
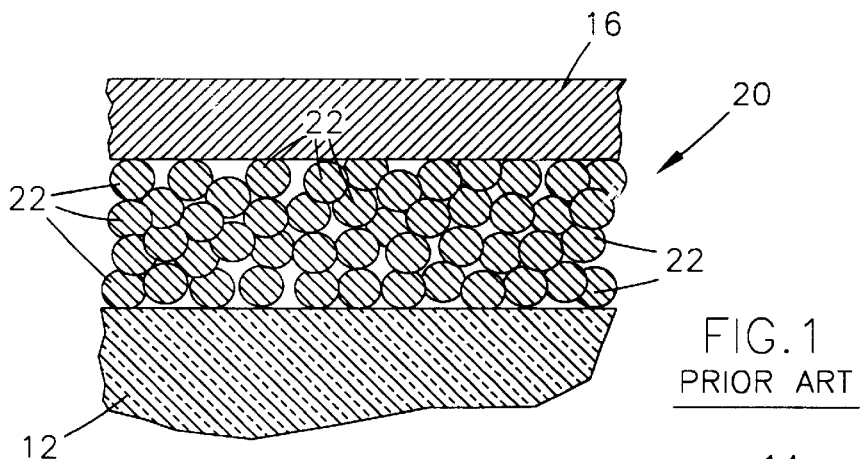
FIG. 1 is a cross-sectional representation of a conductor formed from a thick-film conductor paste of the prior art.
Figure 2:
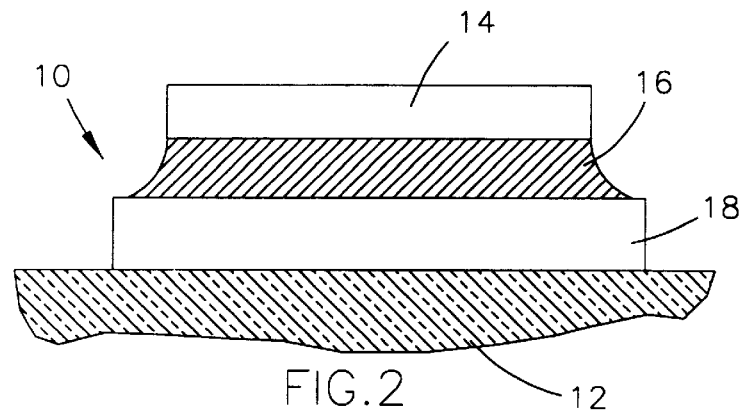
FIG. 2 shows, in cross-section, a portion of a thick-film hybrid circuit having a circuit component mounted with invention.

As noted above, thick-film conductors of the type represented in FIG. 4 find use in thick-film hybrid circuits of the type shown in FIG. 2. The advantages of this invention are evident when applied to essentially any thick-film hybrid circuit, including those hybrid circuits exposed to high temperatures over extended periods of time, during which tin tends to diffuse from the solder 16 into the conductor 18, and the intermetallic region between the solder 16 and conductor 18 tends to grow appreciably. Therefore, a key aspect of this invention is that the cladding layers 124 and 124a inhibit the leaching of elemental metal from the particles 122 during the soldering operation and the diffusion of tin from the solder 16 into the conductor 18 during subsequent high temperature excursions, thereby significantly promoting the conductor-solder bond strength and inhibiting the formation of the undesirable intermetallic region. By reducing the size of the intermetallic region, the adhesion characteristics of the conductor 18 and solder 16 are significantly promoted, and the service-life of a thick-film hybrid circuit utilizing this invention is substantially lengthened.

In the course of experimentation leading to this invention, several tests were performed to evaluate various combinations of materials for both the cladding layer 124 and the metallic powder, as indicated in Table I below.

TABLE I

| Powder | Powder Metal | Cladding Material | Cladding Quantity (ppm) | Cladding Thickness* (Angstroms) |
|---|---|---|---|---|
| A | Pd | $ZrO_2$ | 480 | 0.47 |
| B | Pd | $ZrO_2$ | 1585 | 1.47 |
| C | Pd | $Al_2O_3$ | 481 | 1.03 |
| D | Pd | $Al_2O_3$ | 1462 | 1.43 |
| E | Ag | $ZrO_2$ | 480 | 1.05 |
| F | Ag | $ZrO_2$ | 1150 | 1.51 |
| G | Ag | $Al_2O_3$ | 510 | 1.01 |
| H | Ag | $Al_2O_3$ | 1380 | 2.23 |

*Values calculated assuming spherical particles and uniform, continuous cladding thickness.

As indicated in Table I, the cladding materials evaluated were alumina and zirconia applied at one of two approximate quantity levels, measured as cladding oxide content in parts per million (ppm). The thicknesses noted in Table I were calculated on the presumption that the coatings were continuous, but have values of less than the dimension of a single atom or molecule. Therefore, it was concluded that the coatings were not continuous, but instead were discontinuous. The clad silver powders (E–H) were evaluated alone, admixed with the clad palladium powders (A–D) at a ratio of 3:1, and admixed with unclad palladium powders at a ratio of 3:1, as indicated in Table II below. To provide a baseline, conductors formed from unclad silver and palladium powders were also evaluated. Each powder mixture was combined with suitable inorganic additives and an organic binder, printed on an alumina substrate, and then fired at conventional temperatures to form a thick-film conductor.

Sheet resistances of the resulting conductors were measured using a serpentine pattern typically used for that purpose. Measured sheet resistance of the thick-film conductors ranged from about 15 to about 23 milliohms/square for the 3Ag:1Pd conductors and about 1.7 to about 2.5 milliohms/square for the pure silver conductors. These ranges correspond to the resistance of conductors made utilizing prior art conductor pastes.

Table II summarizes the solderability and adhesion strength characteristics of the thick-film conductors formed from the tested powder mixtures. Solderability of the conductors with 60Sn/40Pb solder was evaluated via a wetting test in which alumina substrates covered with conductor material were immersed in molten solder and the wetting force applied by the solder was measured. The adhesion strengths of the conductor/solder combinations were determined by using a wire lead peel test. Peel test samples were fabricated by dip-soldering tinned copper wires to pads of conductor material. Wire leads were forcibly removed and the force required to do so was recorded after intervals of 24 and 48 hours at 170° C.

TABLE II

| Powder Mixture | Wetting Force[1] (mN) | Adhesion Strength (N) After Aging at 170° C. | | |
|---|---|---|---|---|
| | | 0 hrs. | 24 hrs. | 48 hrs. |
| 3Ag:1Pd Metallic Powder Conductors | | | | |
| unclad | 10.54 | 22.5 | 15.3 | 13.8 |
| A + E | 6.65 | 19.0 | 12.4 | 11.6 |
| B + F | 4.86 | 19.8 | 14.4 | 16.3 |
| C + G | 5.37 | 21.2 | 15.9 | 16.4 |
| D + H | 6.49 | 18.6 | 9.6 | 13.6 |
| H + Pd[2] | 7.36 | 24.4 | 21.0 | 20.1 |
| Ag Metallic Powder Conductors | | | | |
| unclad | 14.63 | 17.8 | 0 | 0 |
| E | 14.41 | 18.4 | 0 | 0 |
| F | 11.32 | 13.8 | 0 | 0 |
| G | 7.91 | 12.8 | 6.8 | 5.9 |
| H | 4.53 | 7.2 | 0 | 0 |

Note 1:
Measured using a standard pattern with a Multicore Solderability Tester, manufactured by Multicore, Hemel Hempstead, Herts, U.K.
Note 2:
Unclad palladium powder.

Generally, the results tabulated in Table II indicated that the presence of cladding reduced the initial wetting capacity of the solder. Surprisingly, the composition of the cladding had a marked effect on the solderability of the pure silver conductors. For example, zirconia cladding on pure silver powders had only a nominal effect on solderability, while alumina cladding had a relatively greater effect on the solderability of conductors made from those same powders.

Finally, peel tests performed on the Ag-Pd samples before and after aging at 170° C. evidenced a marked improvement in adhesion strength of conductors formed from clad powders as compared to those formed from unclad powders. In contrast, only those pure silver conductors formed from powders coated with the thinner alumina cladding survived twenty-four hours at 170° C.; i.e., zirconia and thicker alumina cladding appeared to have no effect on aged adhesion properties of silver conductors. Based on the Ag-Pd samples, it can be seen that aged adhesion strength had a tendency to increase as the ability of the solder to initially wet the conductor decreased. Therefore, a correlation appears that would suggest that aged adhesion and solderability could be balanced to accommodate a particular application. Improved aged adhesion in the case of the clad powders was attributed to reduced tin diffusion and reduced intermetallic formation.

An additional experiment was performed to determine if silver leach resistance was increased by the presence of a cladding layer. Leach resistance was inferred by dipping samples printed with a serpentine pattern of conductor material into molten 60Sn/40Pb solder. The resistance of the serpentine pattern was measured initially and after each dip. The number of dips required to reach a resistance of greater than 30 MW was recorded as an indication of leach resistance for the pattern in the experimental set-up used. The leach resistance of conductors formed from the "E," "G" and "H" clad silver powders exhibited a significant increase in leach resistance as compared to conductors formed from an unclad pure silver powder, as evidenced by the number of times the conductor could be dipped into the molten solder before infinite resistance resulted.

While the invention has been described in terms of a preferred embodiment, other forms could be adopted by one skilled in the art. For example, various processing techniques could be employed to form the clad powders, variations in physical characteristics of the cladding layer could be adopted, and powder and cladding materials could be employed other than those specifically tested. Also, different substrate materials, including co-fired laminate structures, can be used to support the conductor described in this invention. Accordingly, the scope of our invention is to be limited only by the following claims.

The embodiments of the invention in which an exclusive property or privilege is claimed are defined as follows:

1. A thick-film circuit including a substrate, a conductor composition printed, dried and fired at a firing temperature on the substrate to form a thick-film conductor, and a circuit component electrically and mechanically connected to the thickfilm conductor with a tin-based solder, the improvement wherein:

the firing temperature is approximately 500–700 degrees C.; and
   the conductor composition comprises:
      metallic particles selected from the group of silver, palladium, platinum, copper and gold particles; and
      an inorganic coating on the surface of each of said particles, said coating being selected from the group of oxides, silicides and nitrides of aluminum, zirconium, beryllium, tungsten, magnesium, calcium, niobium, titanium and zinc, and oxides of nickel, rhodium and molybdenum, and oxides and nitrides of silicon.

2. The thick film circuit set forth in claim 1, wherein said coating is discontinuous on the surface of each of said particles.

3. The thick film circuit set forth in claim 1, wherein said powder further comprises unclad metallic particles mixed with said particles.

4. The thick film circuit set forth in claim 1, wherein said coating is continuous on the surface of each of said particles.

5. The thick film circuit set forth in claim 1, wherein each of said particles further comprises a continuous metallic coating overlying said coating.

6. A thick-film circuit including a substrate, a conductor composition printed, dried and fired at a firing temperature on the substrate to form a thick-film conductor, and a circuit component electrically and mechanically connected to the thick-film conductor with a tin-based solder, the improvement wherein:

the firing temperature is approximately 850–1000 degrees C.; and the conductor composition comprises:
      metallic particles selected from the group of silver, palladium, platinum, copper and gold particles; and
      an inorganic coating on the surface of each of said particles, said coating being selected from the group of oxides, silicides and nitrides of aluminum, zirconium, beryllium, tungsten, magnesium, calcium, niobium, titanium and zinc, and oxides and nitrides of silicon.

7. The thick film circuit set forth in claim 6, wherein said coating is discontinuous on the surface of each of said particles.

8. The thick film circuit set forth in claim 6, wherein said powder further comprises unclad metallic particles mixed with said particles.

9. The thick film circuit set forth in claim 6, wherein said coating is continuous on the surface of each of said particles.

10. The thick film circuit set forth in claim 6, wherein each of said particles further comprises a continuous metallic coating overlying said coating.

* * * * *